(12) United States Patent
Kan

(10) Patent No.: US 8,254,172 B1
(45) Date of Patent: Aug. 28, 2012

(54) WEAR LEVELING NON-VOLATILE SEMICONDUCTOR MEMORY BASED ON ERASE TIMES AND PROGRAM TIMES

(75) Inventor: Alan Chingtao Kan, Diamond Bar, CA (US)

(73) Assignee: Western Digital Technologies, Inc., Irvine, CA (US)

(*) Notice: Subject to any disclaimer, the term of this patent is extended or adjusted under 35 U.S.C. 154(b) by 347 days.

(21) Appl. No.: 12/571,264

(22) Filed: Sep. 30, 2009

(51) Int. Cl.
*G11C 11/34* (2006.01)

(52) U.S. Cl. ......... 365/185.12; 365/185.02; 365/185.11; 365/185.24; 365/185.29; 365/185.3; 365/185.33; 365/189.16; 365/206; 365/230.03

(58) Field of Classification Search ............. 365/185.02, 365/185.11, 185.12, 185.24, 185.29, 185.3, 365/185.33, 189.16, 206, 230.03
See application file for complete search history.

(56) References Cited

U.S. PATENT DOCUMENTS

| | | | | |
|---|---|---|---|---|
| 6,016,275 | A * | 1/2000 | Han | 365/185.29 |
| 2009/0091978 | A1* | 4/2009 | Yeh | 365/185.09 |
| 2009/0125671 | A1* | 5/2009 | Flynn et al. | 711/103 |
| 2010/0287328 | A1* | 11/2010 | Feldman et al. | 711/103 |

* cited by examiner

*Primary Examiner* — Fernando Hidalgo

(57) ABSTRACT

A non-volatile semiconductor memory is disclosed comprising a memory device including a plurality of memory segments. A program command is issued to the memory device to program a memory segment, and a program time required to execute the program command is saved. An erase command is issued to the memory device to erase the memory segment, and an erase time required to execute the erase command is saved. A wear leveling algorithm is executed for the memory segment in response to the program time and the erase time.

12 Claims, 9 Drawing Sheets

US 8,254,172 B1

WEAR LEVELING NON-VOLATILE SEMICONDUCTOR MEMORY BASED ON ERASE TIMES AND PROGRAM TIMES

BACKGROUND

A non-volatile semiconductor memory may be employed as mass storage for a computer system (e.g., desktop, laptop, portable, etc.) or a consumer device (e.g., music player, cell phone, camera, etc.) or other suitable application. The non-volatile semiconductor memory may comprise one or more memory devices (such as a flash memory) and control circuitry for accessing each memory device. Each memory device is coupled to an I/O bus, as well as a number of interface control lines. When issuing a program command or an erase command to a memory device, the control circuitry transfers the address and command data (and write data for a program operation) over the I/O bus. When issuing a read command, the control circuitry transfers the address and command data over the I/O bus and then receives the read data over the I/O bus. After receiving the command, the memory device executes the command internally over an "access time". To determine when the memory device has successfully finished executing the command, the control circuitry typically polls the memory device by issuing a "command status" request wherein the memory device transmits the contents of a command status register to the control circuitry.

Each memory device typically comprises one or more memory arrays programmed in segments referred to as "pages". A number of pages are grouped into a "block", wherein a page is erased by erasing the entire block of pages. Accordingly, different pages of a single block (or partial pages) may be programmed over a number of program cycles before erasing the block with an erase cycle. Each time a block is erased/programmed, the integrity of the block degrades such that the block will eventually fail. The specification for the memory device typically identifies a nominal number of erase/program cycles the device may endure before failing. In order to maximize the endurance of each memory device, a wear leveling algorithm is typically employed which helps evenly distribute the erase/program cycles over a number of the blocks (all or a portion of the blocks).

DETAILED DESCRIPTION OF EMBODIMENTS OF THE INVENTION

Figure 1A:
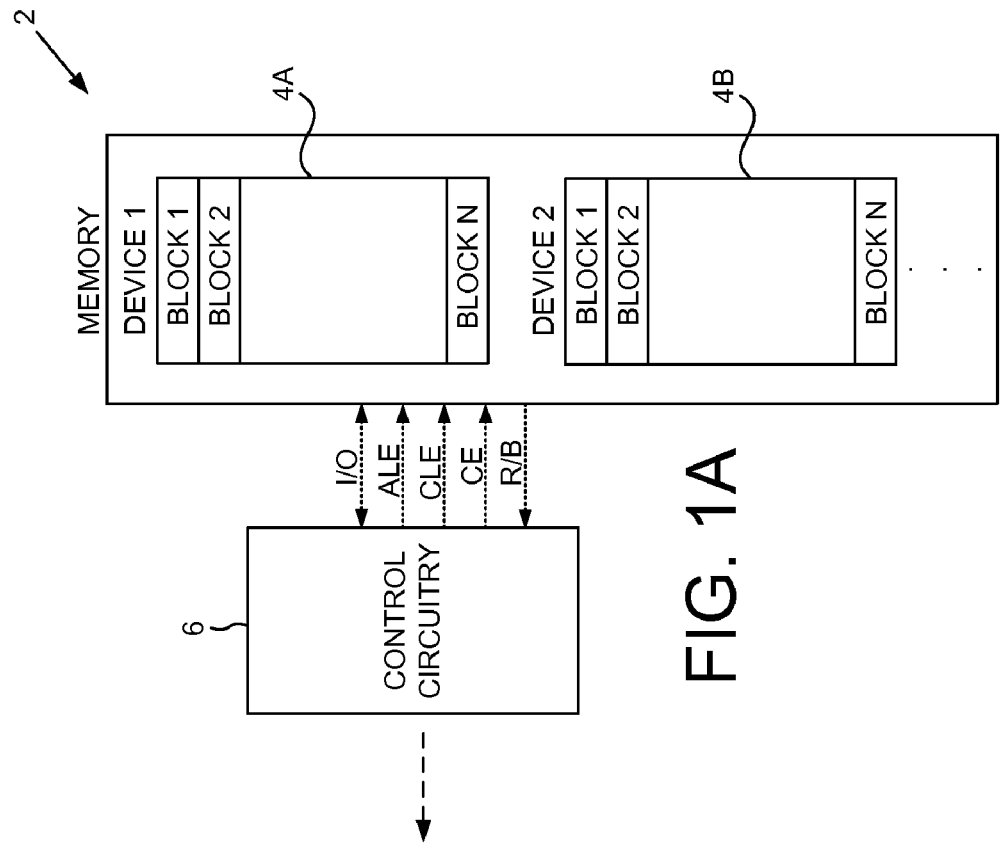
FIG. 1A shows a non-volatile semiconductor memory according to an embodiment of the present invention comprising a memory device including a plurality of memory segments, and control circuitry.
Figure 1B:
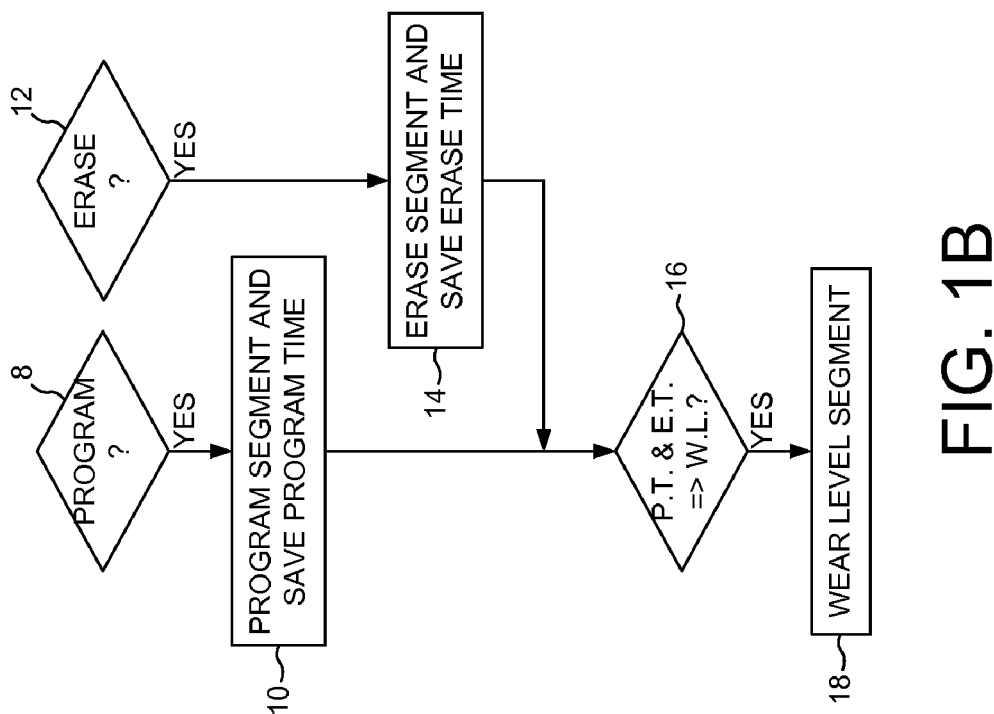
FIG. 1B is a flow diagram executed by the control circuitry for wear leveling a memory segment in response to a program time and an erase time according to an embodiment of the present invention.

FIG. 1A shows a non-volatile semiconductor memory 2 according to an embodiment of the present invention comprising a memory device 4A including a plurality of memory segments. The non-volatile semiconductor memory 2 further comprises control circuitry 6 for executing the flow diagram of FIG. 1B in order to wear level a memory segment. A program command is issued to the memory device to program a memory segment (step 8), and a program time required to execute the program command is saved (step 10). An erase command is issued to the memory device to erase the memory segment (step 12), and an erase time required to execute the erase command is saved (step 14). A wear leveling algorithm is executed for the memory segment (step 18) in response to the program time and the erase time (step 16).

The non-volatile semiconductor memory 2 may comprise any suitable configuration of control circuitry 6 and memory devices 4A-4B. In one embodiment, each memory device 4A-4B comprises a suitable flash memory (e.g., NAND or NOR flash), and the control circuitry 6 comprises a suitable flash controller. In one embodiment, the control circuitry 6 implements a solid state drive (SSD) by emulating a disk drive accessible by a host system using a standard disk drive communication protocol (e.g., the ATA protocol). In addition, the memory segment that is evaluated for wear leveling may comprise any suitable size, such as a page in a block of pages or an entire block.

Figure 2A:
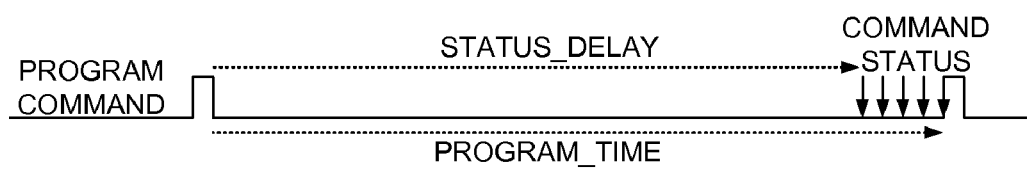
FIGS. 2A-2B show an embodiment of the present invention wherein a program time and an erase time for a memory segment is determined by reading a status register.
Figure 2B:
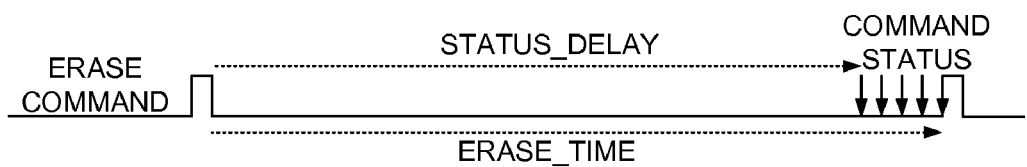

The program time and erase time of a memory segment may be determined in any suitable manner. In one embodiment, the memory device 4A toggles a ready/busy control line which is monitored by the control circuitry 6 to determine when the memory device has completed a program or erase command. In another embodiment, the memory device toggles a bit in a status register which is polled by the control circuitry 6. This embodiment is illustrated in FIGS. 2A and 2B wherein after the control circuitry 6 issues a program command or erase command to the memory device, the control circuitry 6 waits for a STATUS_DELAY period and then begins polling the memory device for the status register. In one embodiment, the status register comprises a bit that indicates when the memory device has completed an erase command and/or a program command, including a cache mode program command. That is, if the memory device comprises a cache register and a data register, the status register may comprise a bit that indicates when the data stored in the data register has been transferred to the memory segment (e.g., page) of a memory array.

Figure 3:
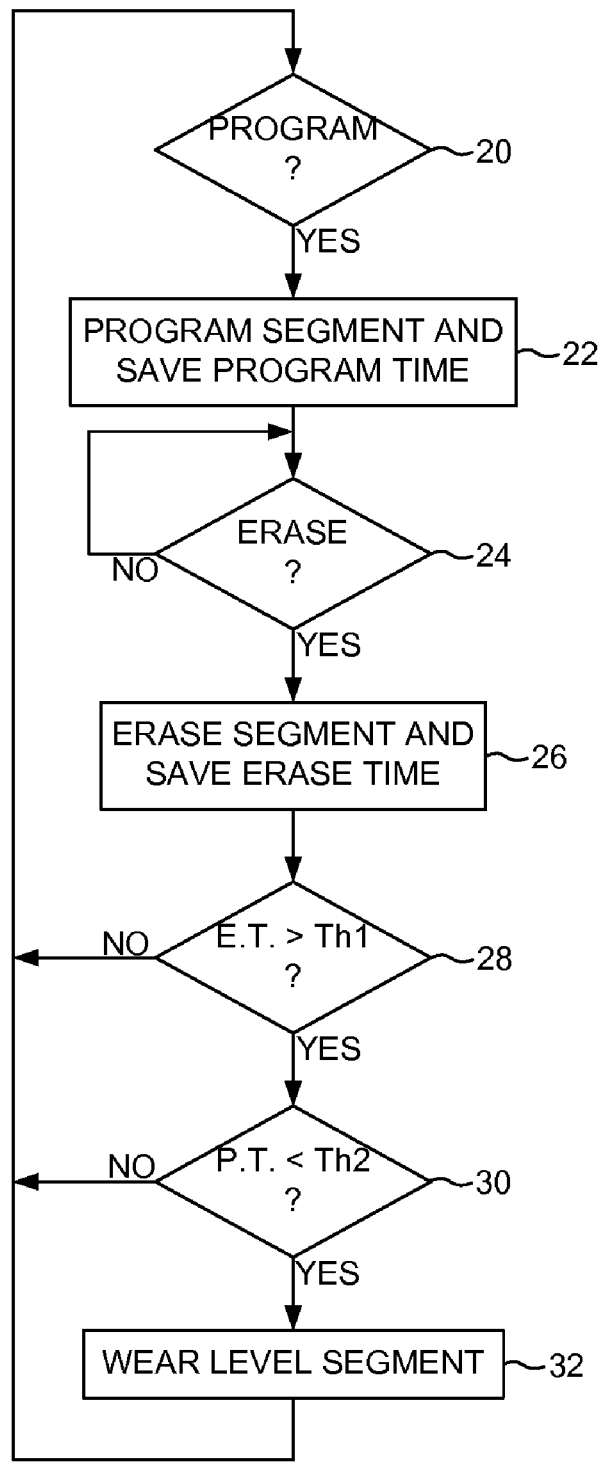
FIG. 3 is a flow diagram according to an embodiment of the present invention wherein wear leveling a memory segment is triggered when the erase time exceeds a threshold and the program time exceeds a threshold.

The program time and erase time may be evaluated using any suitable algorithm to determine whether to wear level a memory segment. FIG. 3 shows a flow diagram according to an embodiment of the present invention wherein when a program command is generated (step 20), a memory segment is programmed and the program time saved (step 22). Subsequently when a erase command is generated to erase the memory segment (step 24), the memory segment is erased and the erase time is saved (step 26). If the erase time exceeds a threshold (e.g., rises above threshold Th1 in step 28), and the program time exceeds a threshold (e.g., falls below threshold Th2 in step 30), then the wear level algorithm is executed on the memory segment (step 32). The program and erase times may exceed a threshold in either direction depending on how the endurance of the memory device degrades. That is, a degrading endurance may be reflected by an increase or decrease in the erase and program times depending on the characteristics of the memory device.

Figure 4A:
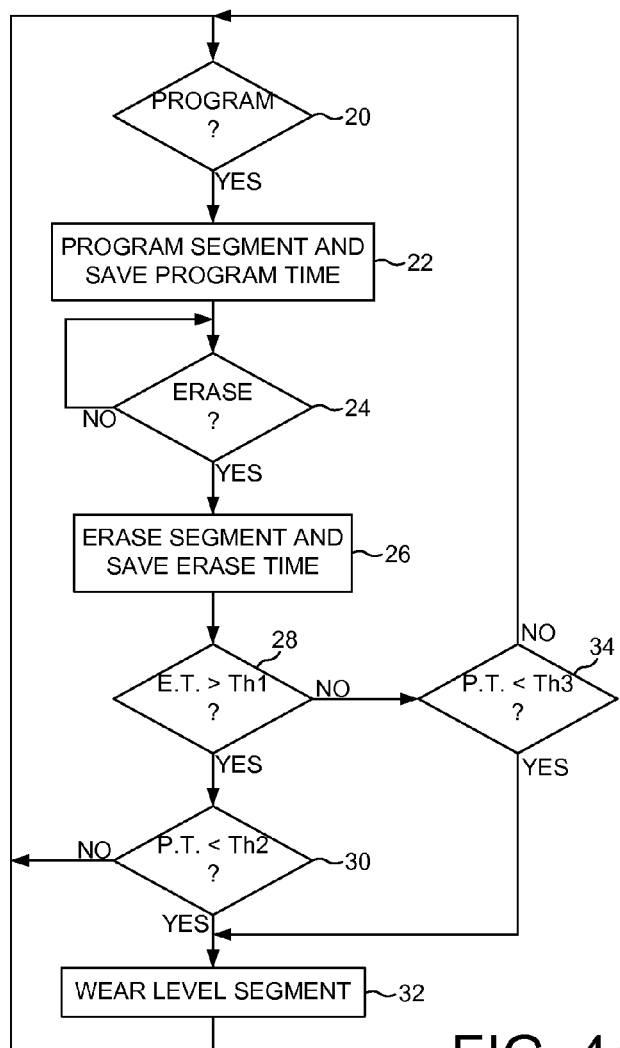
FIG. 4A is a flow diagram according to an embodiment of the present invention wherein wear leveling a memory segment is triggered when the erase time exceeds a threshold relative to the program time, or the program time exceeds a threshold independent of the erase time.
Figure 4B:
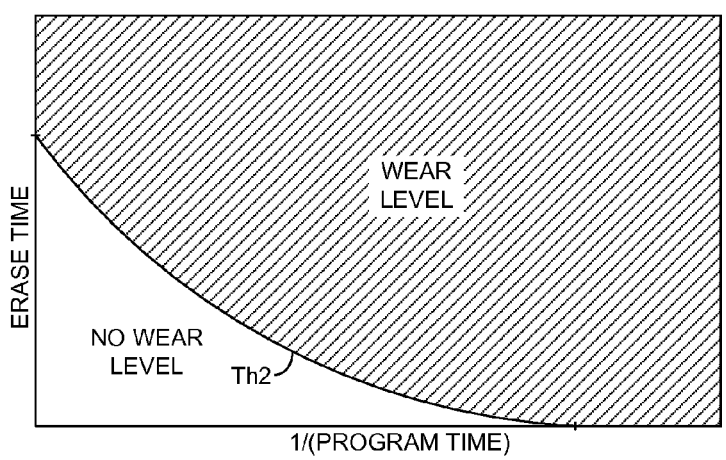
FIG. 4B shows a function according to an embodiment of the present invention wherein wear leveling is triggered relative to the erase time and the program time.

FIG. 4A is a flow diagram that extends on the flow diagram of FIG. 3 wherein if the erase time does not exceed threshold Th1 (step 28), but the program time exceeds a more stringent threshold Th3, then the wear level algorithm is executed on the memory segment (step 32). In this embodiment, wear leveling of a memory segment is performed independent of the erase time once the program time exceeds a predetermined threshold. Similarly, wear leveling of a memory segment may be performed independent of the program time once the erase time exceeds a predetermined threshold. This embodiment is illustrated in FIG. 4B which shows the values of erase times and program times where the wear leveling algorithm is triggered. In the embodiment of FIG. 4B, the function that defines the threshold Th2 is an inverse quadratic; however, any suitable function may be employed.

Figure 5A:
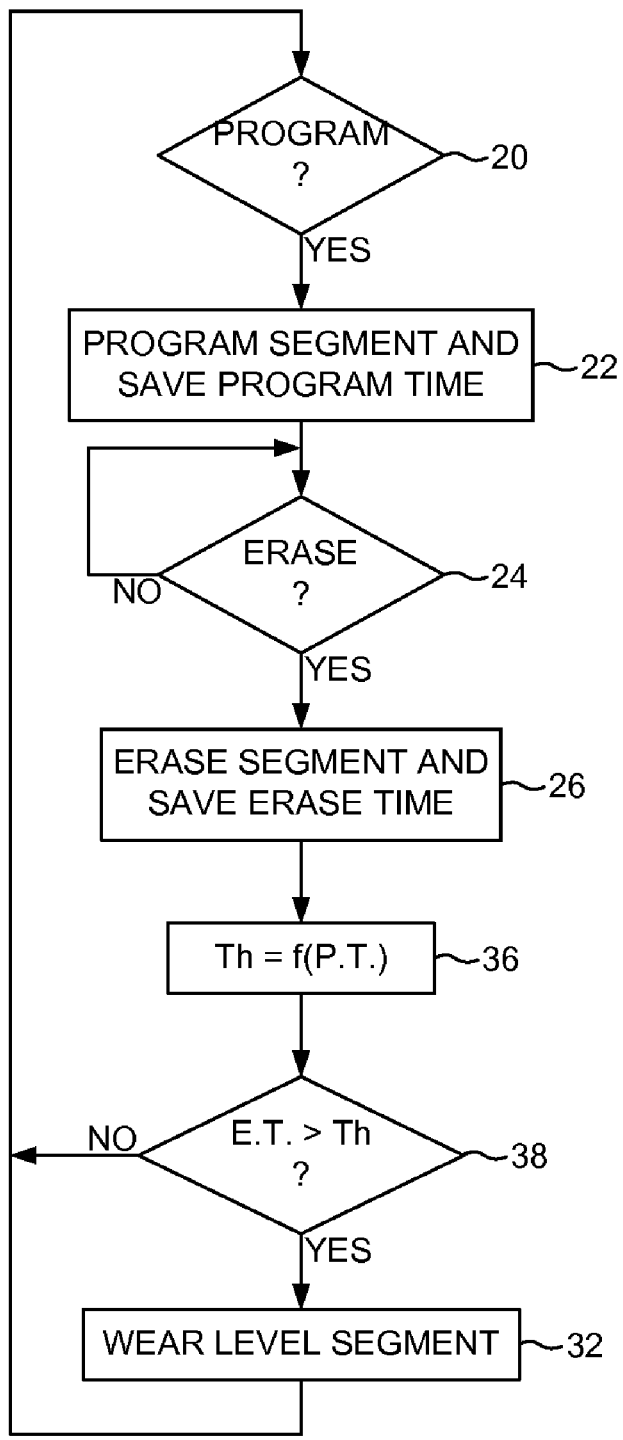
FIG. 5A is a flow diagram according to an embodiment of the present invention wherein wear leveling a memory segment is triggered when the erase time exceeds a threshold computed as a function of the program time.
Figure 5B:
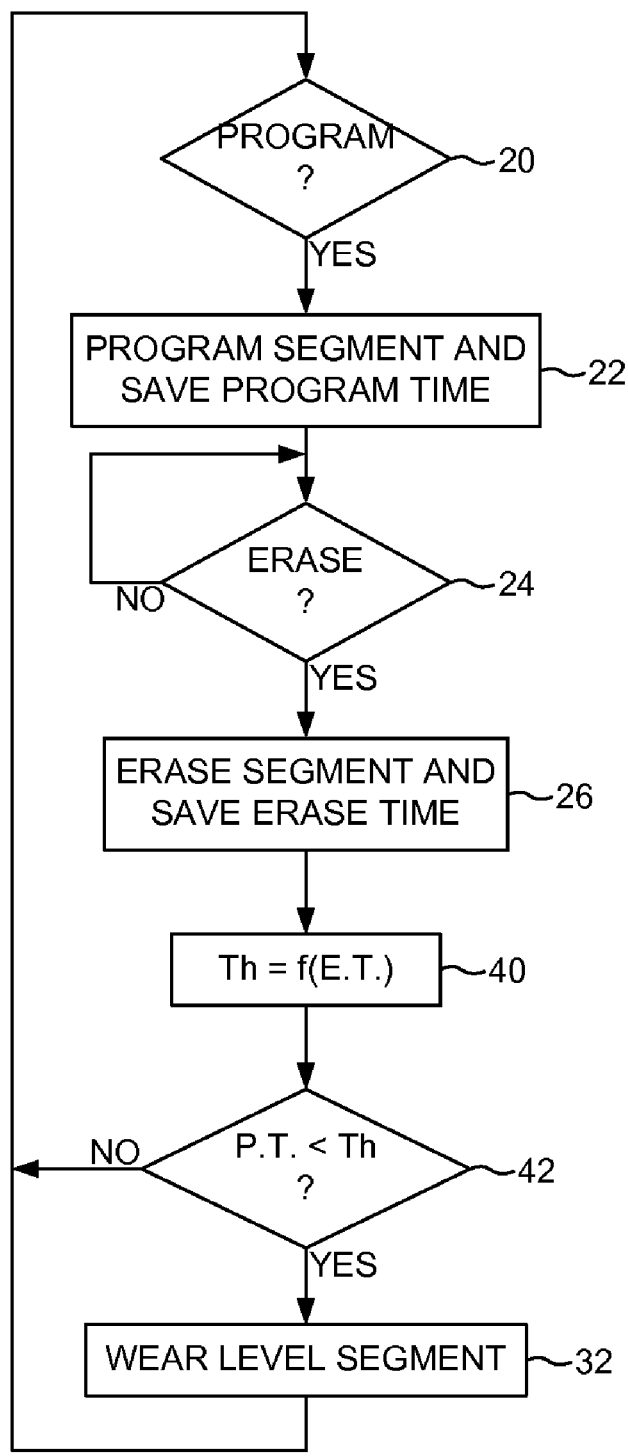
FIG. 5B is a flow diagram according to an embodiment of the present invention wherein wear leveling a memory segment is triggered when the program time exceeds a threshold computed as a function of the erase time.

FIG. 5A is a flow diagram that extends on the flow diagram of FIG. 3 wherein a threshold is computed as a function of the program time (step 36), and the wear level algorithm is executed on the memory segment (step 32) if the erase time exceeds the threshold (step 38). Any suitable function may be employed to compute the threshold, such as the inverse quadratic shown in FIG. 4B. FIG. 5B shows an alternative embodiment wherein a threshold is computed as a function of the erase time (step 40), and the wear level algorithm is executed on the memory segment (step 32) if the program time exceeds the threshold (step 42).

Figure 6A:
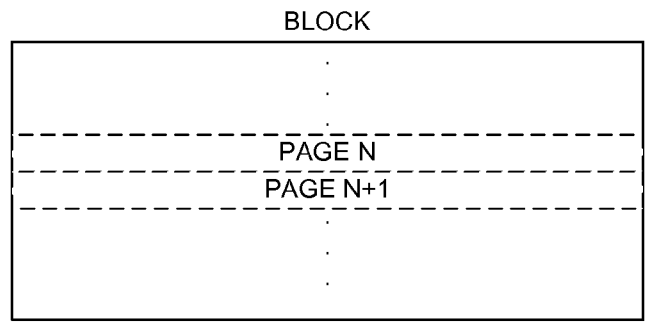
FIG. 6A shows an embodiment of the present invention wherein the memory device comprises a plurality of blocks, and each block comprises a plurality of pages.

FIG. 6A shows an embodiment of the present invention wherein the memory device comprises a memory array including a plurality of blocks, and each block comprises a plurality of pages. The memory device is programmed by writing a page of data from a data register to a target page in the memory array, and in order to erase a page, the entire block is erased.

Figure 6B:
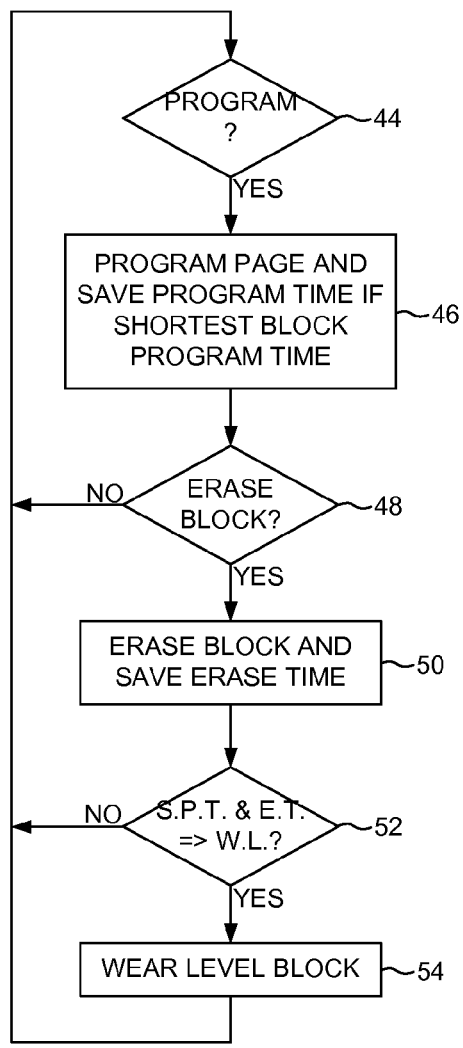
FIG. 6B is a flow diagram according to an embodiment of the present invention wherein the shortest block program time is saved when programming a plurality of pages in the block, and wear leveling a block is triggered in response to the shortest block program time and the block erase time.

FIG. 6B is a flow diagram according to an embodiment of the present invention wherein when a page in a block is programmed (step 44), the program time is saved if it is the shortest program time for the block (step 46). When an erase command is generated for the corresponding block (step 48), the block is erased and the block erase time is saved (step 50). If the shortest program time and the block erase time indicate the block is degrading (step 52), the wear level algorithm is executed on the block (step 54).

Figure 6C:
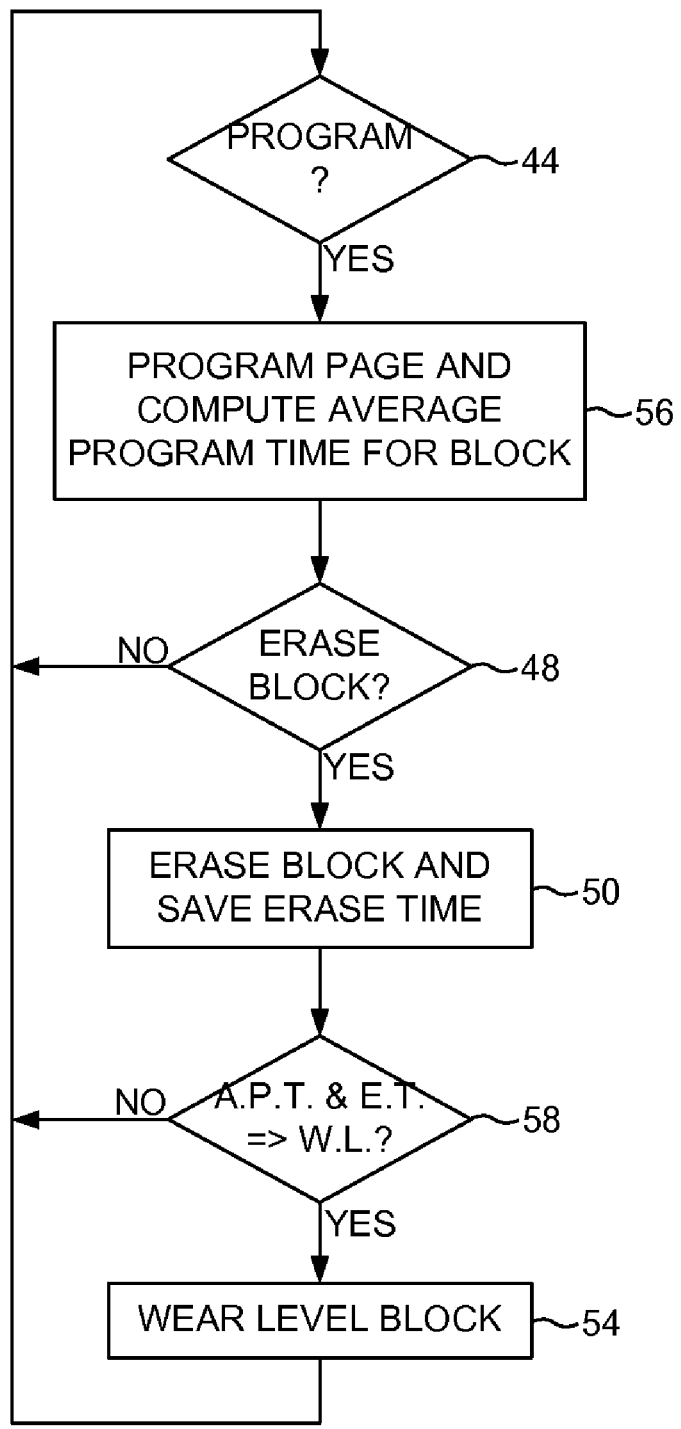
FIG. 6C is a flow diagram according to an embodiment of the present invention wherein the average block program time is saved when programming a plurality of pages in the block, and wear leveling a block is triggered in response to the average block program time and the block erase time.

FIG. 6C is a flow diagram according to an embodiment of the present invention which extends on the flow diagram of FIG. 6B wherein the average program time for the pages in a block is computed each time a page is programmed (step 56). If the average program time and the block erase time indicate the block is degrading (step 58), the wear level algorithm is executed on the block (step 54). Other embodiments may employ different types of filters (rather than averaging), and in one embodiment, outliers may be thrown out of the computation.

Figure 7:
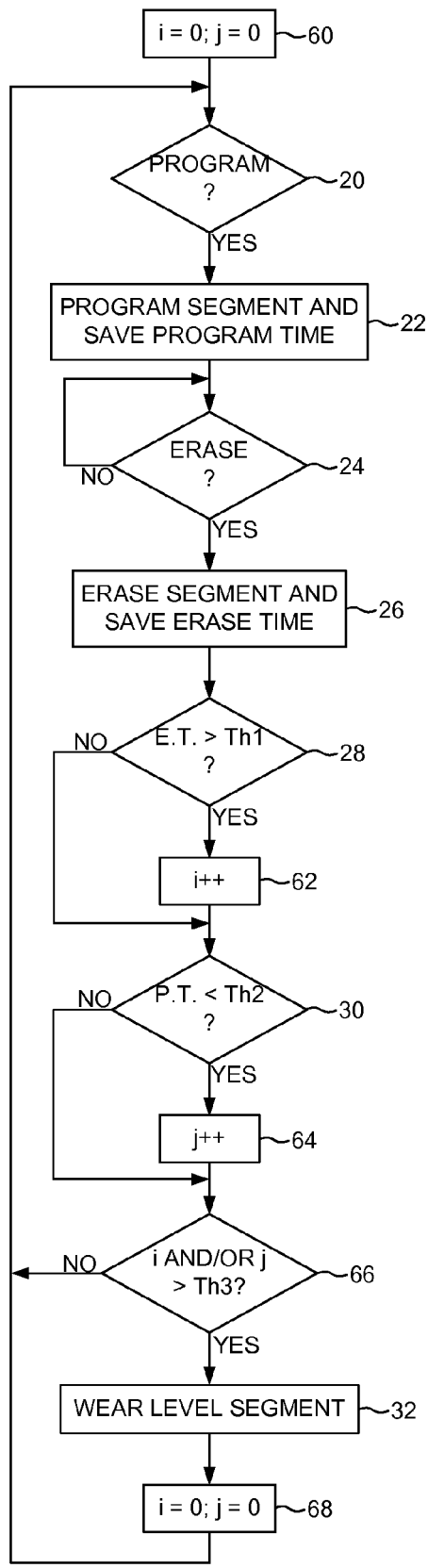
FIG. 7 is a flow diagram according to an embodiment of the present invention wherein the wear leveling algorithm is executed on a memory segment when either or both of the erase time and/or the program time exceed respective thresholds multiple times.

FIG. 7 is a flow diagram according to an embodiment of the present invention which extends on the flow diagram of FIG. 3, wherein a counter i and a counter j track the number of times the erase times and the program times exceed their respective thresholds. The counters are initialized to zero (step 60) and then counter i is incremented (step 62) each time the erase time exceeds threshold Th1 (step 28), and counter j is incremented (step 64) each time the program time exceeds threshold Th2 (step 30). If either or both of the counters i and/or j exceed a threshold Th3 (step 66), the wear level algorithm is executed on the memory segment (step 32). The counters i and j are then reset to zero (step 68) and the process is repeated.

Any suitable wear leveling algorithm may be employed in the embodiments of the present invention. In one embodiment, the wear leveling algorithm prioritizes the use of the memory segments so as to help evenly distribute the erase/program cycles over a number of the memory segments (e.g., all or a portion of the blocks). In another embodiment, when a memory segment degrades significantly the wear leveling algorithm may map out the memory segment so that it's no longer used. In addition, the wear leveling algorithm may operate immediately after detecting a degrading memory segment, or the wear leveling algorithm may flag the memory segment as degrading and then perform suitable remedial action when the control circuitry is idle (not processing read/write commands).

What is claimed is:

1. A non-volatile semiconductor memory comprising a memory device including a plurality of memory segments, and control circuitry operable to:
   issue a program command to the memory device to program a memory segment, and save a program time required to execute the program command;
   issue an erase command to the memory device to erase the memory segment, and save an erase time required to execute the erase command; and
   wear level the memory segment when the erase time is greater than a first threshold and the program time is less than a second threshold.

2. The non-volatile semiconductor memory as recited in claim 1, wherein the control circuitry is further operable to:
   determine the second threshold as a function of the program time.

3. The non-volatile semiconductor memory as recited in claim 1, wherein the control circuitry is further operable to:
   determine the first threshold as a function of the erase time.

4. The non-volatile semiconductor memory as recited in claim 1, wherein the memory segment comprises a page out of a block of pages, and the control circuitry is further operable to wear level the memory segment by:

issuing a plurality of program commands to the memory device to program a plurality of pages in a block;

saving the shortest program time for the block out of the plurality of pages;

issuing an erase command to the memory device to erase the block and save a block erase time required to execute the erase command; and wear leveling the block when the block erase time is greater than the first threshold and the shortest program time is less than the second threshold.

5. The non-volatile semiconductor memory as recited in claim 1, wherein the memory segment comprises a page out of a block of pages, and the control circuitry is further operable to wear level the memory segment by:

issuing a plurality of program commands to the memory device to program a plurality of pages in a block;

saving an average program time for the block out of the plurality of pages;

issuing an erase command to the memory device to erase the block and save a block erase time required to execute the erase command; and wear leveling the block when the block erase time is greater than the first threshold and the average program time is less than the second threshold.

6. The non-volatile semiconductor memory as recited in claim 1, wherein the control circuitry is further operable to:

first count a number of times the program time is less than the second threshold;

second count a number of times the erase time is greater than the first threshold; and wear level the memory segment when at least one of the first and second counts exceeds a threshold.

7. A method of operating a non-volatile semiconductor memory comprising a memory device including a plurality of memory segments, the method comprising:

issuing a program command to the memory device to program a memory segment, and saving a program time required to execute the program command;

issuing an erase command to the memory device to erase the memory segment, and saving an erase time required to execute the erase command; and wear leveling the memory segment when the erase time is greater than a first threshold and the program time is less than a second threshold.

8. The method as recited in claim 7, further comprising:
determining the second threshold as a function of the program time.

9. The method as recited in claim 7, further comprising:
determining the first threshold as a function of the erase time.

10. The method as recited in claim 7, wherein the memory segment comprises a page out of a block of pages, and wherein the wear leveling further comprises:

issuing a plurality of program commands to the memory device to program a plurality of pages in a block;

saving the shortest program time for the block out of the plurality of pages;

issuing an erase command to the memory device to erase the block and saving a block erase time required to execute the erase command; and wear leveling the block when the block erase time is greater than the first threshold and the shortest program time is less than the second threshold.

11. The method as recited in claim 7, wherein the memory segment comprises a page out of a block of pages, and wherein the wear leveling further comprises:

issuing a plurality of program commands to the memory device to program a plurality of pages in a block;

saving an average program time for the block out of the plurality of pages;

issuing an erase command to the memory device to erase the block and saving a block erase time required to execute the erase command; and wear leveling the block when the block erase time is greater than the first threshold and the average program time is less than the second threshold.

12. The method as recited in claim 7, further comprising:
first counting a number of times the program time is less than the second threshold;

second counting a number of times the erase time is greater than the first threshold; and wear leveling the memory segment when at least one of the first and second counts exceeds a threshold.

* * * * *